(12) United States Patent
Richards

(10) Patent No.: US 9,046,553 B2
(45) Date of Patent: Jun. 2, 2015

(54) METHOD AND APPARATUS FOR DYNAMIC SIGNAL SWITCHING OF A MERGING UNIT IN AN ELECTRICAL POWER SYSTEM

(75) Inventor: Simon Richards, Abbots Bromley (GB)

(73) Assignee: ALSTOM GRID UK LTD, Stafford (GB)

( * ) Notice: Subject to any disclaimer, the term of this patent is extended or adjusted under 35 U.S.C. 154(b) by 740 days.

(21) Appl. No.: 13/123,505

(22) PCT Filed: Oct. 9, 2008

(86) PCT No.: PCT/EP2008/063547
§ 371 (c)(1),
(2), (4) Date: Jun. 22, 2011

(87) PCT Pub. No.: WO2010/040409
PCT Pub. Date: Apr. 15, 2010

(65) Prior Publication Data
US 2011/0241654 A1    Oct. 6, 2011

(51) Int. Cl.
*G01R 15/18*    (2006.01)
*G01R 19/25*    (2006.01)
*G01R 15/14*    (2006.01)
*H02H 1/04*    (2006.01)
*H02H 3/05*    (2006.01)

(52) U.S. Cl.
CPC .......... *G01R 19/2513* (2013.01); *G01R 15/146* (2013.01); *H02H 1/046* (2013.01); *H02H 3/05* (2013.01)

(58) Field of Classification Search
CPC .   G01R 15/146; G01R 19/2513; G01R 31/027
USPC ................................. 324/127, 126, 415, 424
See application file for complete search history.

(56) References Cited

U.S. PATENT DOCUMENTS

| 4,761,606 A | 8/1988 | Germer et al. |
| 6,751,767 B1* | 6/2004 | Toumiya ....................... 714/738 |
| 6,954,704 B2 | 10/2005 | Minami et al. |
| 2002/0053911 A1* | 5/2002 | Saitoh ........................... 324/424 |
| 2003/0234642 A1 | 12/2003 | Clegg et al. |
| 2005/0140352 A1* | 6/2005 | Allain et al. .................. 323/357 |

(Continued)

FOREIGN PATENT DOCUMENTS

| EP | 0300075 A1 | 1/1989 |
| EP | 1845383 A2 | 10/2007 |
| FR | 2835319 A1 | 8/2003 |

OTHER PUBLICATIONS

Zhang, J. et al., "A New Method to Realize the Relay Protection of AOCT Following IEC61850," International Conference on Power System Technology, IEEE, Oct. 2006, pp. 1-5.

(Continued)

*Primary Examiner* — Tung X Nguyen
*Assistant Examiner* — Giovanni Astacio-Oquendo
(74) *Attorney, Agent, or Firm* — Nixon Peabody LLP

(57) ABSTRACT

A method and an apparatus for dynamic signal switching with multiple measurement sources, for a merging unit in an electrical power system, said merging unit receiving at least two input signals from at least one current transformer measuring the same physical primary quantity. The method comprises a step of outputting from said merging unit, in a real-time mode, a digitized output stream of sampled values with the truest representation of the physical primary quantity, based on the actual values of the input signals.

9 Claims, 5 Drawing Sheets

(56) References Cited

U.S. PATENT DOCUMENTS

2008/0065270 A1* 3/2008 Kasztenny et al. ........... 700/286
2009/0174425 A1* 7/2009 Kang ........................... 324/763
2010/0153036 A1* 6/2010 Elwarry et al. ................ 702/62

OTHER PUBLICATIONS

International Search Report and Written Opinion in International Application No. PCT/EP2008/063547, mailed Aug. 10, 2009.

* cited by examiner

METHOD AND APPARATUS FOR DYNAMIC SIGNAL SWITCHING OF A MERGING UNIT IN AN ELECTRICAL POWER SYSTEM

CROSS REFERENCE TO RELATED APPLICATIONS or PRIORITY CLAIM

This application is a National Phase of PCT/EP2008/063547, filed Oct. 9, 2008, entitled, "METHOD AND APPARATUS FOR DYNAMIC SIGNAL SWITCHING OF A MERGING UNIT IN AN ELECTRICAL POWER SYSTEM".

BACKGROUND OF THE INVENTION

1. Field of the Invention

This invention relates to a method and an apparatus for dynamic signal switching of a merging unit in an electrical power system.

2. Description of the Related Art

Intelligent electronic devices are installed in electrical power systems to measure the voltage and current flows running through the electrical network. Said intelligent electronic devices may attempt to use these measurements in order to protect the power system against faults or abnormal oscillations, and to allow better control of the power system by human or automatic operators.

Traditionally, such measurements have been made using current and voltage transformers, transforming the power grid quantities into more manageable, safer, lower magnitude scaled quantities for input to intelligent electronic devices.

There is presently a growing trend to digitize the output of such current transformers and voltage transformers, for ease of communication and connection to intelligent electronic devices in an electrical substation automation scheme.

The same existing current transformers and voltage transformers can have their scaled, secondary side analogue signals converted into digital signals by a device termed a "Merging Unit". The field of the present invention relates to the case where multiple current transformer inputs are available at one location, nominally offering redundancy/duplication of the same measured quantity. This is often the case where a current transformer core for protection applications and another core for measurement applications are available.

As the measurement core (measurement accuracy class) is more accurate for load currents, said measurement core would normally be considered the truest representation of the real primary current quantity on the power system. As to higher level fault current flows, the measurement current transformer core may saturate, making its output an erroneous representation of the real primary input. In such instances, the protection current transformer core having a larger dynamic range (and better immunity to saturation) would be a better scaled representation of the primary quantity.

Historically, the secondary wired current transformer circuits would have needed to run cross-site, from the primary power system equipment in the electrical substation yard, to the physical substation building where the intelligent electronic device would have been situated.

This cross-site run of current transformer circuits is potentially dangerous, as an inadvertent open circuit could yield dangerous voltages and sparking/arcing in the vicinity of the break. Hence, it is desirable to site the merging unit close to the current transformer secondary circuit which the former is digitizing.

We will then consider prior art documents.

U.S. Pat. No. 6,954,704 describes a digital protection and control device. Indeed, in conventional protection and control systems, since analog information transmitted through electric cables is used for information transmission between substation main equipments and protection and control devices that protect and control these substation main equipments, contact input circuits and contact output circuits handling a relatively large voltage and current have been required. Further, a space for disposing a large number of electric cables is necessary, and a protection unit and a control unit need to be accommodated in independent cases provided exclusively for the respective units, which has been a cause of the increase in installation space of the devices. U.S. Pat. No. 6,954,704 provides a digital protection and control device configured to realize reduction in installation space thereof by the digitalization of the device, and to realize improvement in protection and control performance by sufficient data exchange in the device. Therefore, U.S. Pat. No. 6,954,704 describes the basic principles of a merging unit.

EP 1 845 383 describes a method of detecting saturation of a current transformer. Said method involves detecting a fault of a secondary current/voltage waveform of a current transformer. A magnetic flux in the secondary of the transformer is estimated by integration of the secondary current during a time window from the detection of the fault. The estimated magnetic flux is compared with a threshold value, where saturation of the transformer is detected while the threshold value exceeds the magnetic flux.

There is no existing solution to allow the input from duplicate (or multiple) measurement sources to combine as a single "optimized" one.

The only way this could be achieved today is to have two separate merging units, each digitizing only one 3-phase set of current transformer signals. The two merging units would then multicast two separate measurements of sampled values, which could be connected to the same Ethernet link. Hypothetically, any intelligent electronic devices could be configured so as to be capable to read the two (or more) separate sources concurrently, and choose between them according to quality bits which are available in the input signals. However, no intelligent electronic device on the market today can offer such capability.

SUMMARY OF THE INVENTION

Accordingly, it is a general object of the present invention to provide a method and an apparatus for dynamic signal switching of a merging unit, wherein the merging unit chooses the best input signal in terms of accuracy and reliability and generates a digitized output from that quantity.

In order to achieve the above-mentioned object, there is provided according to one aspect of the present invention, a method for dynamic signal switching with multiple measurement sources, for a merging unit in an electrical power system, said merging unit receiving at least two input signals from at least one current transformer measuring the same physical primary quantity, characterized in that it comprises a step of outputting from said merging unit, in a real-time mode, a digitized output stream of sampled values with the truest representation of the physical primary quantity, based on the actual values of the input signals.

An embodiment of the invention comprises the following steps:
  a current transformer live detection step,
  a current transformer supervision step,
  a current transformer saturation detection step,
  a current level detection step.

In an embodiment the input signals are:
protection class inputs as three individual phase currents, and
measurement class inputs as three individual phase currents.

The merging unit may receive input signals from two current transformers, or two output cores from the same current transformer.

Advantageously, the merging unit receives input signals from a protection current transformer and from a measurement current transformer, wherein the output of the merging unit is selected from the measurement current transformer samples, unless saturation for that current transformer is present, or is predicted to occur soon. Advantageously, once switching to the protection current transformer input has been done, this new signal source is held in priority until it can be ensured that the entire instance of the high current flow has reset. Moreover, when there is a switch from one signal source to the other, the transition may be smoothed-in.

In order to achieve the above-mentioned object, there is provided according to another aspect of the present invention an apparatus for dynamic signal switching with multiple measurement sources, of a merging unit in an electrical power system, comprising at least one multiple input current transformer, a primary interface, the merging unit receiving at least two input signals from said at least one transformer measuring the same physical primary quantity and digitizing current transformer signals, a process bus, a protection relay, a station bus, a control system, characterized in that said merging unit comprises means for selecting dynamically and in real time the best unsaturated input signal in an automatic process and delivering a single outgoing stream of digitized analogue values.

Advantageously, the apparatus comprises a protection current transformer and a measurement current transformer. Moreover, it may comprise means for predicting the expected value of next sample, which looks at the present sample value magnitude and at least one previous sample, and means for comparing the real sample with the expected value to detect a possible saturation.

Connected intelligent electronic devices can then be configured with a single input from the merging unit which is at the same time accurate enough for measurement purposes, and has the dynamic range for protection applications.

The invention makes it possible for the merging unit to connect to two separate current transformer secondaries (typically each one is a three phase set of phase current transformer inputs, with a neutral current transformer in some cases), so that the outgoing Ethernet stream of digitized analogue values is a single combined signal, and not two separate signals. The invention is not limited only to two current transformer sets, but may be extended to applications with multiple current transformer sets.

A significant advantage of the invention is that only one merging unit is used, and that it is able to combine the inputs from two sources in order to select one output as the best for communicating to connected intelligent electronic devices.

The combination into a single signal according to certain construction rules (implemented as numerical algorithms) reduces the traffic on the Ethernet, and allows connected intelligent electronic devices which support only one signal source to offer both protection and measurement class functionalities. Without the merging unit having the ability to combine the signals before multicasting, the connected intelligent electronic devices would only have been able to offer protection or measurement accuracy, not both together.

Those connected intelligent electronic devices can then implement measurement and protection functions. Yet, measurement functions would be provided in prior art protection intelligent electronic devices, but these would be low accuracy measurements for indicative purposes only. For revenue purposes (trading and billing) accuracy requirements would therefore have precluded applications within protection intelligent electronic devices.

In the present invention, the intelligent electronic devices are receiving a single merged signal which is both accurate enough for all measurement applications, and has the full dynamic range for protection applications, the intelligent electronic devices being able to perform both tasks. This reduces device duplication, and costs.

The accuracy of the merging unit output at low to moderate currents also improves the accuracy of protection functions which are generally "low-set" (i.e. not related to high short-circuit values), such as generator and motor power protection functions, thermal overload, winding interturn protection, and various forms of earth-fault protection functions on systems with fault current limiting (e.g. resistive earthed systems).

DESCRIPTION OF THE PREFERRED EMBODIMENTS

Figure 1:
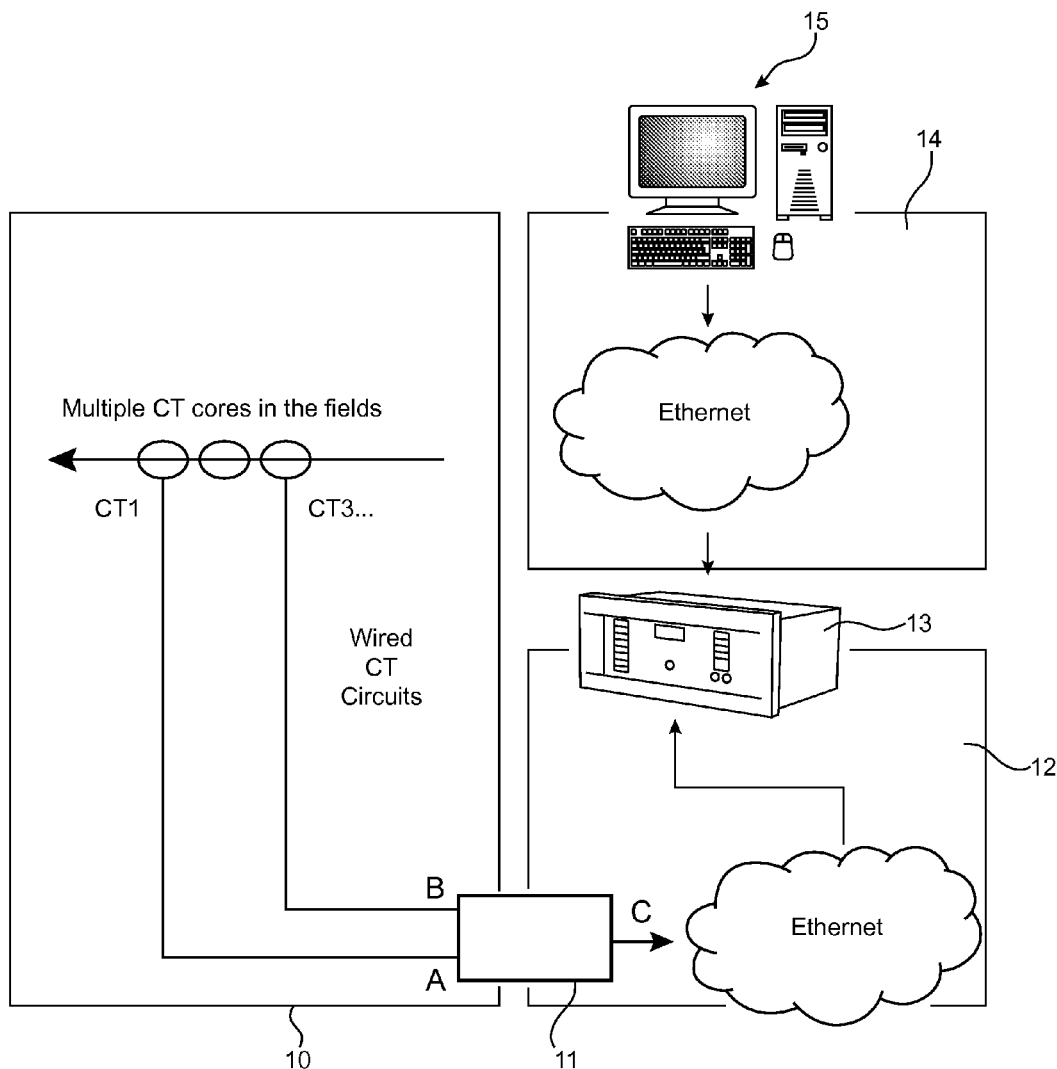
FIG. 1 shows an embodiment of the invention apparatus in a single line diagram application.

FIG. 1 shows a typical application, in a single line diagram. On said figure are represented:
a primary interface and hardwiring 10,
a merging unit 11,
a process bus 12, for example a IEC 61850-9.2 bus,
a protection relay 13,
a station bus 14, for example a IEC 61850-9.2 station bus,
a control system 15.

In the invention, the merging unit 11 has two inputs A and B and an output C such that:
A is a first current input (e.g. from a protection class current transformer core).
B is a second current input, possibly measurement class.
C is a combined output of a single stream of measurements, for example IEC 61850-9.2 measurements, based on the real-time best selection from inputs A and B.

Figure 2:
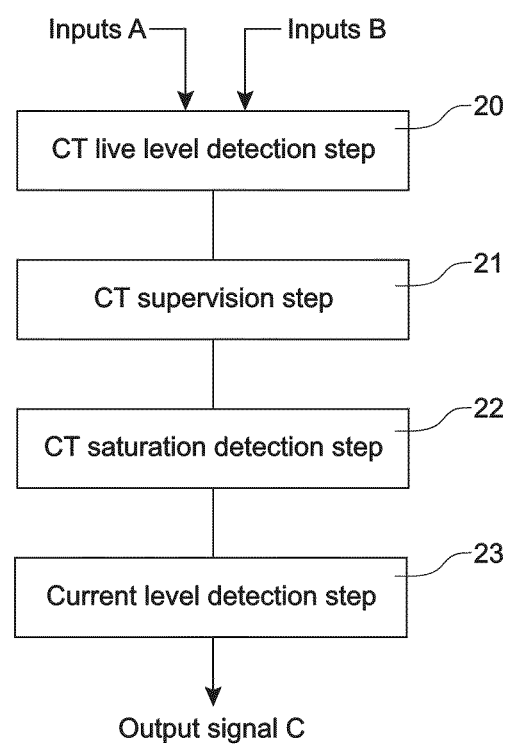
FIG. 2 shows the method steps of an embodiment of the invention.

FIG. 2 shows the steps of the invention process in a preferred embodiment, in which the inputs are inputs A (Protection class inputs as three individual, phase currents) and inputs B (measurement class inputs as three individual, phase currents) and the output is an output signal C.

Said steps are the following ones:
1) a current transformer (CT) live level detection step 20, in which is determined which current inputs have a level of load or fault current flowing such as to indicate that the CT has a live output and may be considered potentially suitable to be taken as a valid measurement source, 2) a current transformer supervision step 21, in which is determined which three phase current input(s) is/are healthy (no broken wires, correct phase rotation, balanced when the network voltages indicate they should be balanced), 3) a current transformer saturation detection step 22, in which is determined whether any current transformer experiences an unexpected decrease in output (or an alternative technique to detect the onset of saturation), said decrease being not accompanied by a similar decrease on the same phase of other inputs, 4) a current level detection step 23, in which is determined which inputs risk exceeding their accuracy limit factors (the rated measurement range limits before saturation).

The output signal C is derived from B if: (1) B is Live, (2) B is Healthy, (3) B has No Saturation, and (4) B has No Current Excess, and, derived from A if: (1) A is Live, (2) A is Healthy, and B fails any healthiness, saturation, or dynamic range excess test as per 1-4 above In the invention, the merging unit 10 receives wired signals from two current transformers CTi, or two output cores from the same physical current transformer, and then provides a single combined signal as digitized output. We may have more than two input signals, two signals being a typical application. Said input signals are essentially measuring the same physical primary quantity on the power system itself, and are provided to give redundancy in measurement, or more typically for different measuring ranges and accuracy classes.

The merging unit 10 is able to perform an intelligent merging of the two signals into one, which is expected to give the best representation of the real primary power system quantity on a real time basis. As the digital output data stream is in sampled values format, in a fast real-time mode the merging unit selects on a per sample basis the most accurate output it is able to achieve, based on the two (or more) available inputs.

In an embodiment, a phase current signal on the power system is measurable by a protection current transformer core, and a measurement current transformer core. The two current transformers have different characteristics of core design, and hence a different magnetizing curve from each other. The measurement current transformer may belong for example to Class 0.2, meaning that current measurement is very accurate, with generally no greater than 0.2% error rate. The protection current transformer may belong for example to Class 5P, meaning that the error rate could now be as great as 5%. The output of the measurement current transformer is thus better (more accurate), except at high currents where its output may saturate. A measurement current transformer is only designed for accuracy in the range of 0-120% of rated current, and typically above 200% rated current (400% in some cases) its output will become unreliable. A measurement current transformer can thus measure load current reliably, but is not dimensioned to cover the full dynamic range of power network short-circuit currents. The protection current transformer will typically cover 20 to 50 times rated current before appreciable core saturation, and therefore provides a more reliable measurement of current high values.

The merging unit is able to make an intelligent selection from which of the two signals appears to include no saturation, biasing towards the measurement current transformer output if the latter shows no saturation.

Figure 3:
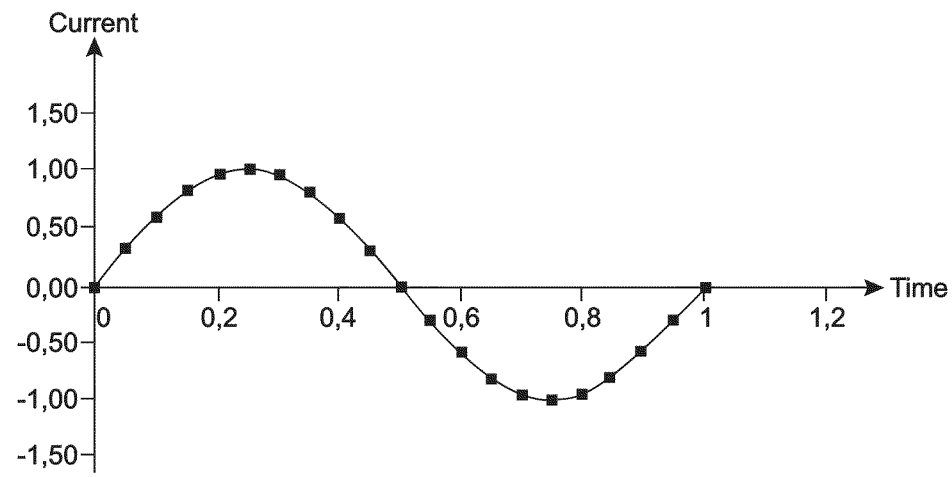
FIG. 3 shows output from a measurement class current transformer at load currents.

FIG. 3 shows a theoretical sinusoidal alternating current (AC) load current, with the dots showing the idealized sampled value outputs (just 20 samples within the AC cycle are shown in this example, although 80 or 256 samples per cycle would be more common according to a standard IEC 61850-9.2 application). It can be seen that as the current is a load example, no current transformer will saturate, and the sampled value data stream output is a true representation of the real power system quantity. This can be assumed to be the output of both the protection and the measurement class current transformers, in which case the merging unit will select the measurement class input as the basis of its output, thanks to the greater accuracy.

Figure 4:
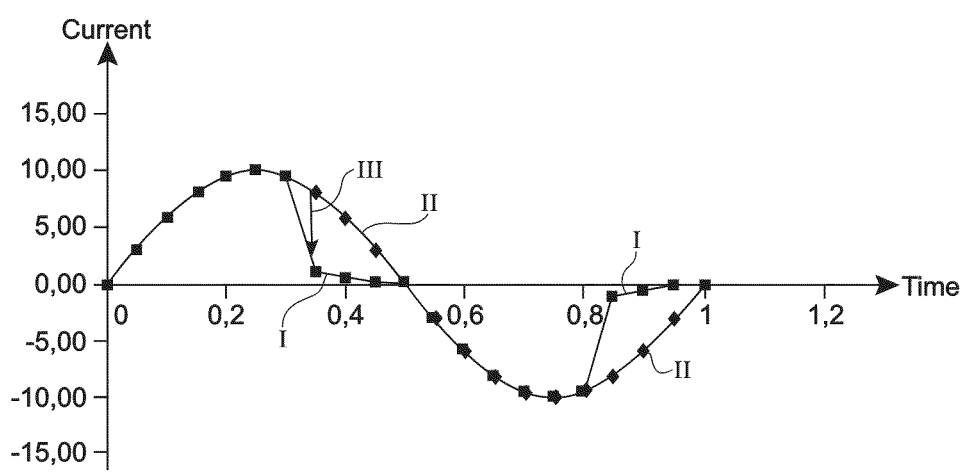
FIG. 4 shows output from a measurement class current transformer at fault current exhibiting saturation, with a protection class current transformer output being unaffected.

FIG. 4 shows an example of two current transformers measuring the same signal. It is assumed that both are being viewed on the same basis (given that, in some instances, the primary to secondary current transformation ratios of the two may differ). The example shown is a fault current value, with the dotted line I showing the output of the measurement class current transformer, and line II showing the output of the protection current transformer. It can be seen that for a portion of each half cycle, the measurement current transformer core saturates, and the output is unrealistically low compared to the real fault current. The error in the first sample of saturation is indicated by arrow III. The protection current transformer represents the full cycle of current, unsaturated and accurate, as shown by line II.

A preferred technique for the invention is for each measurement source to have a numerical algorithm which makes it possible to obtain the present sampled value magnitude, and compares with one or more of the previous samples to estimate the general trend of the sinusoidal curve. On this basis, the expected value of the next sample can be predicted. If the next incoming sample unexpectedly falls lower in magnitude than the prediction, the onset of saturation is detectable, as per the arrow III, in the diagram of FIG. 4. Conversely, if the waveshape of the sampled values indicates a rate of rise so steep that it will inevitably lead to saturation, this can be used to switch the signals in advance.

In FIG. 3 and FIG. 4, the used units are "multiples of rated current" (rated current is the nominal load current, so the scale is a effectively a per unit scalar value of "overload").

Figure 5:
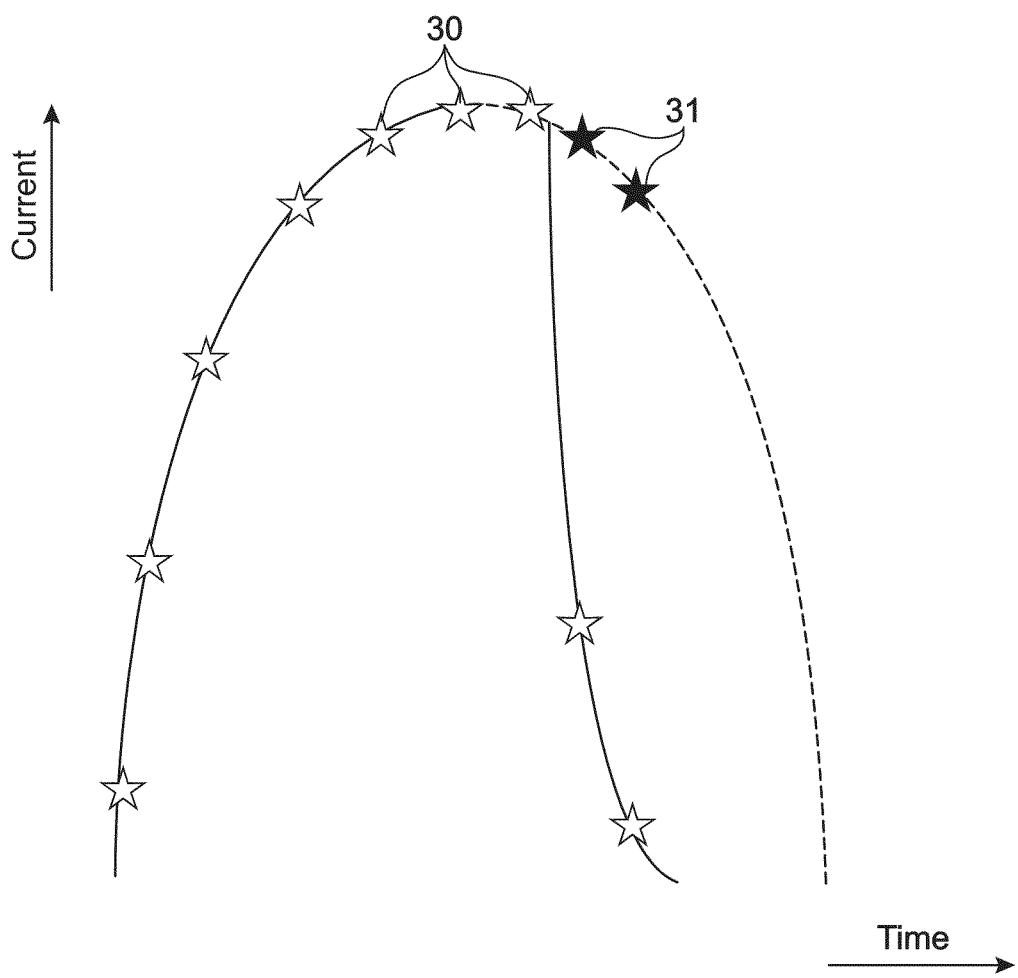
FIG. 5 shows half a cycle of a current wave with time shown for an example numerical algorithm.

FIG. 5 illustrates a numerical algorithm, in an example half cycle of a current wave with time shown. References 30 corresponds to actual current samples. References 31 corresponds to predicted samples if no saturation occurs (it assumes a sinusoidal profile). It can even be a straight line assumption at typical merging unit sample rates of 80 or 256 samples per cycle.

The merging unit will normally select its output from the measurement current transformer samples, unless it detects that saturation is present, or is predicted to occur soon.

Although switching from one current transformer source to another could be done on a per sample basis, it is preferred that the switching is not happening at multiple times within each 50 or 60 Hz AC power cycle. Thus, once switching to the protection current transformer input has been done, this new signal source can be held in priority until it can be ensured that the entire instance of the high current flow has reset (which can last up to 3 seconds in an electrical distribution system or 1 second in a transmission grid). This temporary reversal of the signal priority selection is acceptable as the duration on the power system stays small, and the window of time during which the measurement accuracy is impaired is small too.

When the switch from one signal source to the other occurs, the merging unit may take steps to smooth-in the transition. For example, if the protection current transformer and measurement current transformer are both measuring the same rising signal and the protection class current transformer measures said signal 5% higher than the actual one, and the measurement current transformer at 0.2% less than the actual one, there is over 5% difference between the two.

On switching from one source to another, the merging unit may take steps to smooth the transition over a period of a few successive samples, based on its prior knowledge that the two readings were not identical.

Figure 6:
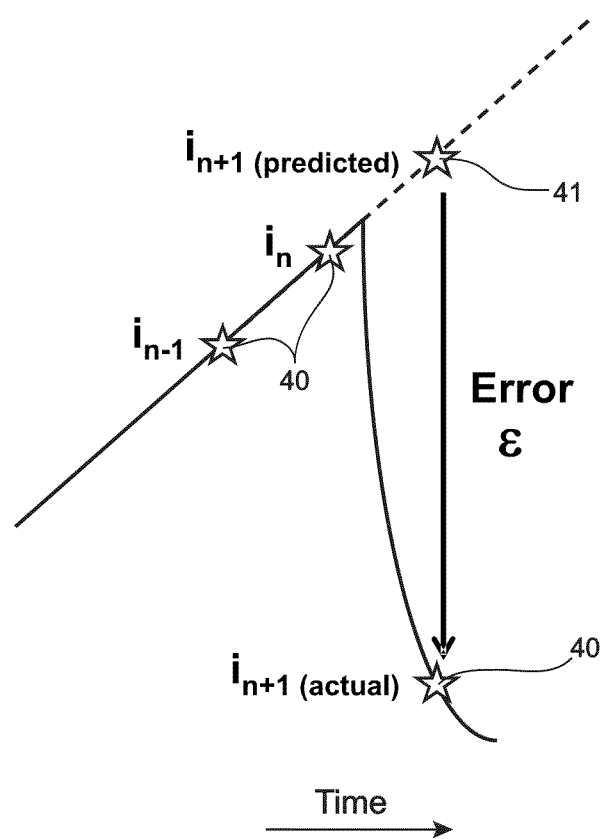
FIG. 6 shows magnification of time period close to the onset of saturation.

FIG. 6 shows the sample method to detect the non-linearity as an error figure $\epsilon$. The CT live, CT supervision and CT level detection steps, referenced as 20, 21 and 23, would normally use the output of a traditional one cycle or half-cycle Fourier transform of the sampled values. Such transformation techniques are commonplace in the industry today.

On said FIG. 6, in which there is a magnification of time period close to the onset of saturation:

References 40 correspond to actual current samples.

Reference 41 corresponds to a predicted sample, if no saturation were to occur (simple straight line assumption shown in this example). As sample time interval remains constant:

$$i_{n+1(predicted)} = i_n + (i_n - i_{n-1})$$

$$\epsilon = i_{n+1(actual)} - i_{n+1(predicted)}$$

If the error $\epsilon$ is greater than an allowable tolerance, a significant non-linearity is detected.

The invention claimed is:

1. A method for dynamic signal switching with multiple measurement sources which are current and voltage transformers, for a merging unit in an electrical power system with intelligent electronic devices connected to said merging unit to measure voltage and current flows running through said electrical power system, in the case where multiple current transformers inputs are available at one location of the electrical power system offering redundancy/duplication of one measured physical primary quantity, wherein the merging unit receives at least one three phase protection class input signal, and at least one three phase measurement class input signal from at least one current transformer or at least two current transformers measuring said physical primary quantity, and combines these input signals and selects in a real-time mode and on a per sample basis one digitized output signal as the best for communicating to the connected intelligent electronic devices, said method comprising the following steps in the merging unit:
    a step of receiving the at least two input signals,
    a detection step of the live level of each current transformer, in which is determined which input signals have a level of load or fault current flowing to indicate which current transformer has a live output and may be considered potentially suitable to be taken as a valid measurement source,
    a current transformer supervision step, in which is determined which input signal(s) is/are healthy,
    a current transformer saturation detection step in which is determined whether any current transformer experiences a determined decrease in its output, said decrease being not accompanied by a similar on the same phase of its inputs,
    a current level detection step, in which is determined which input signals risk exceeding accuracy limit factors,
    a step of combining the input signals and selecting one output signal, and
    a step of outputting, in real-time mode, a digitized output stream of sampled values to the connected intelligent electronic devices.

2. The method pursuant to claim 1, in which the input signals are:
    many protection class inputs as three individual phase currents, and
    many measurement class inputs as three individual phase currents.

3. The method pursuant to claim 1, wherein the merging unit receives input signals from two current transformers, or from two output cores from the same current transformer.

4. The method pursuant to claim 1, wherein the merging unit receives input signals from a protection current transformer and from a measurement current transformer, wherein the output of the merging unit is selected from the measurement current transformer samples, unless saturation for that current transformer is present, or is predicted to occur soon.

5. The method pursuant to claim 4, wherein after switching to the protection current transformer input has been done, this input, which is a new signal source is held in priority until the entire instance of the high current flow has reset.

6. The method pursuant to claim 5, wherein when there is a switch from one signal source to the other, the transition is smoothed-in.

7. An apparatus for dynamic signal switching with multiple measurement sources which are current and voltage transformers, of a merging unit in an electrical power system, with intelligent electronic devices connected to said merging unit to measure voltage and current flows running through said electrical power system, in the case where multiple current transformer inputs are available at one location of the electrical power system offering redundancy/duplication of one measured physical primary quantity, said apparatus comprising:
    a process bus,
    a protection relay,
    a station bus,
    a control system,
wherein the merging unit receives at least one three phase protection class input signal, and at least one three phase measurement class input signal from at least one current transformer or at least two current transformers measuring said physical primary quantity, and combines these input signals and selects in a real-time mode and on a per sample basis one digitized output signal as the best for communicating to the connected intelligent electronic devices.

8. The apparatus pursuant to claim 7, comprising a protection current transformer and a measurement current transformer.

9. The apparatus pursuant to claim 7, comprising means for predicting one expected value of a new input signal, which looks at the present input signal value magnitude and at least one previous input signal, and means for comparing the real input signal with the expected value to detect a possible saturation.

* * * * *